(12) United States Patent
Drake et al.

(10) Patent No.: US 11,776,981 B2
(45) Date of Patent: Oct. 3, 2023

(54) ELIMINATING INTERCONNECT STRAINS IN MICROCIRCUITS

(71) Applicant: RAYTHEON COMPANY, Waltham, MA (US)

(72) Inventors: Paul A. Drake, Friday Harbor, WA (US); Christopher Moshenrose, Encinitas, CA (US); Heather D. Leifeste, Santa Barbara, CA (US)

(73) Assignee: RAYTHEON COMPANY, Waltham, MA (US)

(*) Notice: Subject to any disclaimer, the term of this patent is extended or adjusted under 35 U.S.C. 154(b) by 176 days.

(21) Appl. No.: 16/951,573

(22) Filed: Nov. 18, 2020

(65) Prior Publication Data

US 2022/0157874 A1    May 19, 2022

(51) Int. Cl.
*H01L 27/146* (2006.01)

(52) U.S. Cl.
CPC .... *H01L 27/14634* (2013.01); *H01L 27/1469* (2013.01)

(58) Field of Classification Search
CPC ............. H01L 27/14634; H01L 27/1469
See application file for complete search history.

(56) References Cited

U.S. PATENT DOCUMENTS

| 5,308,980 A | 5/1994 | Barton |
| 7,723,815 B1 * | 5/2010 | Peterson ............... H01L 24/26 |
| | | 257/457 |

OTHER PUBLICATIONS

G. Pavlidis, et al.: Thermal Effects of Substrate Removal on GaN HEMTs using Rama Thermometry 2016 15th IEEE Intersociety Conference on Thermal and Thermomechanical Phenomena in Electronic Systems; doi: 10.1109/ITHERM.2016.7517691; Las Vegas, pp. 1-5.

* cited by examiner

*Primary Examiner* — Meiya Li
(74) *Attorney, Agent, or Firm* — CANTOR COLBURN LLP

(57) ABSTRACT

A method of eliminating interconnect strains in a stack-up is provided. The method includes providing a detector portion including a detector substrate and detector layers, providing a read-out integrated circuit (ROIC) stack-up including ROIC layers and an initial ROIC substrate, removing the initial ROIC substrate from the ROIC layers, attaching a new ROIC substrate to a first surface of the ROIC layers, the new ROIC substrate having a coefficient of thermal expansion (CTE) that matches a CTE of the detector substrate and hybridizing the detector layers to a second surface of the ROIC layers by way of interconnects.

6 Claims, 5 Drawing Sheets

ELIMINATING INTERCONNECT STRAINS IN MICROCIRCUITS

BACKGROUND

The present disclosure relates to electro-optical sensors and, in particular, to methods of eliminating interconnect strains in cooled microcircuits.

Current optical elements struggle with thermal cycle hybrid reliability. Thermal cycle hybrid reliability refers to an ability of a product to maintain the integrity of interconnects between a detector and a read-out integrated circuit (ROIC). This integrity is challenged every thermal cycle that the product experiences due to the differential thermal expansion that normally occurs between the detector and the ROIC.

As operations demand increasing numbers of thermal cycles for certain products (i.e., historically about 2,000 thermal cycles were required but 10,000 or more thermal cycles can be required now), the issues associated with maintaining the integrity of the interconnects between the detector and the ROIC in a given product become more important to address. Also, as arrays in which differential coefficients of thermal expansions (CTEs) exist increase in size and/or need to operate within environments in which operating temperatures trend downward, meeting thermal cycle requirements can become even more difficult.

SUMMARY

According to an aspect of the disclosure, a method of eliminating interconnect strains in a stack-up is provided. The method includes providing a detector portion including a detector substrate and detector layers, providing a read-out integrated circuit (ROIC) stack-up including ROIC layers and an initial ROIC substrate, removing the initial ROIC substrate from the ROIC layers, attaching a new ROIC substrate to a first surface of the ROIC layers, the new ROIC substrate having a coefficient of thermal expansion (CTE) that matches a CTE of the detector substrate and hybridizing the detector layers to a second surface of the ROIC layers by way of interconnects.

In accordance with additional or alternative embodiments, the first surface of the ROIC layers is a lower surface and the second surface of the ROIC layers is an upper surface opposite the lower surface.

In accordance with additional or alternative embodiments, the attaching of the new ROIC substrate to the first surface includes adhering the new ROIC substrate to the first surface and the interconnects are deposited prior to or following the adhering.

In accordance with additional or alternative embodiments, the attaching of the new ROIC substrate to the first surface includes atomic bonding the new ROIC substrate to the first surface and the interconnects are deposited following the atomic bonding.

In accordance with additional or alternative embodiments, the hybridizing includes depositing the interconnects onto the second surface of the ROIC layers.

In accordance with additional or alternative embodiments, the CTE of the new ROIC substrate exactly matches the CTE of the detector substrate.

In accordance with additional or alternative embodiments, the new ROIC substrate includes a same material as the detector substrate.

According to an aspect of the disclosure, method of eliminating interconnect strains in a stack-up is provided. The method includes providing a detector portion including a detector substrate and detector layers, providing a read-out integrated circuit (ROIC) stack-up including ROIC layers and an initial ROIC substrate, thinning the initial ROIC substrate, attaching a new ROIC substrate to a remainder of the initial ROIC substrate, the new ROIC substrate having a coefficient of thermal expansion (CTE) that matches a CTE of the detector substrate and hybridizing the detector layers to an exposed surface of the ROIC layers by way of interconnects.

In accordance with additional or alternative embodiments, the exposed surface of the ROIC layers is an upper surface of the ROIC layers opposite the new ROIC substrate.

In accordance with additional or alternative embodiments, the attaching of the new ROIC substrate to the remainder of the initial ROIC substrate includes adhering the new ROIC substrate to the remainder of the initial ROIC substrate and the interconnects are deposited prior to or following the adhering.

In accordance with additional or alternative embodiments, the attaching of the new ROIC substrate to the remainder of the initial ROIC substrate includes atomic bonding the new ROIC substrate to the remainder of the initial ROIC substrate and the interconnects are deposited following the atomic bonding.

In accordance with additional or alternative embodiments, the hybridizing includes depositing the interconnects onto the exposed surface of the ROIC layers.

In accordance with additional or alternative embodiments, the CTE of the new ROIC substrate exactly matches the CTE of the detector substrate.

In accordance with additional or alternative embodiments, the new ROIC substrate includes a same material as the detector substrate.

According to an aspect of the disclosure, a stack-up is provided and includes a detector portion including a detector substrate and detector layers, a read-out integrated circuit (ROIC) stack-up including ROIC layers, a thinned initial ROIC substrate and a new ROIC substrate attached to the thinned initial ROIC substrate, the new ROIC substrate having a coefficient of thermal expansion (CTE) that matches a CTE of the detector substrate and interconnects by which the detector layers are hybridized to an exposed surface of the ROIC layers.

In accordance with additional or alternative embodiments, the exposed surface of the ROIC layers is an upper surface of the ROIC layers opposite the new ROIC substrate.

In accordance with additional or alternative embodiments, the new ROIC substrate is adhered to the thinned initial ROIC substrate.

In accordance with additional or alternative embodiments, the new ROIC substrate is atomic bonded to the thinned initial ROIC substrate.

In accordance with additional or alternative embodiments, the CTE of the new ROIC substrate exactly matches the CTE of the detector substrate.

In accordance with additional or alternative embodiments, the new ROIC substrate includes a same material as the detector substrate.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, methods of eliminating interconnect strains in cooled microcircuits and other applications are provided and include providing a detector portion with a detector substrate and detector layers and providing a ROIC stack-up with ROIC layers and an initial ROIC substrate The methods further include thinning or removing the initial ROIC substrate and attaching a new ROIC substrate that matches the CTE of the detector substrate to the remainder of the ROIC stack-up by adhesive, an atomic bond or another similar technique in order to form a new ROIC stack-up. In addition, the methods include depositing interconnects onto the new ROIC stack-up and hybridizing the detector portion to the new ROIC assembly by way of the interconnects. The methods thus result in the formation of, for example, a sensor chip assembly (SCA) stack-up in which interconnect strains, which are associated with temperature changes caused by thermal cycling, are eliminated.

Figure 1:
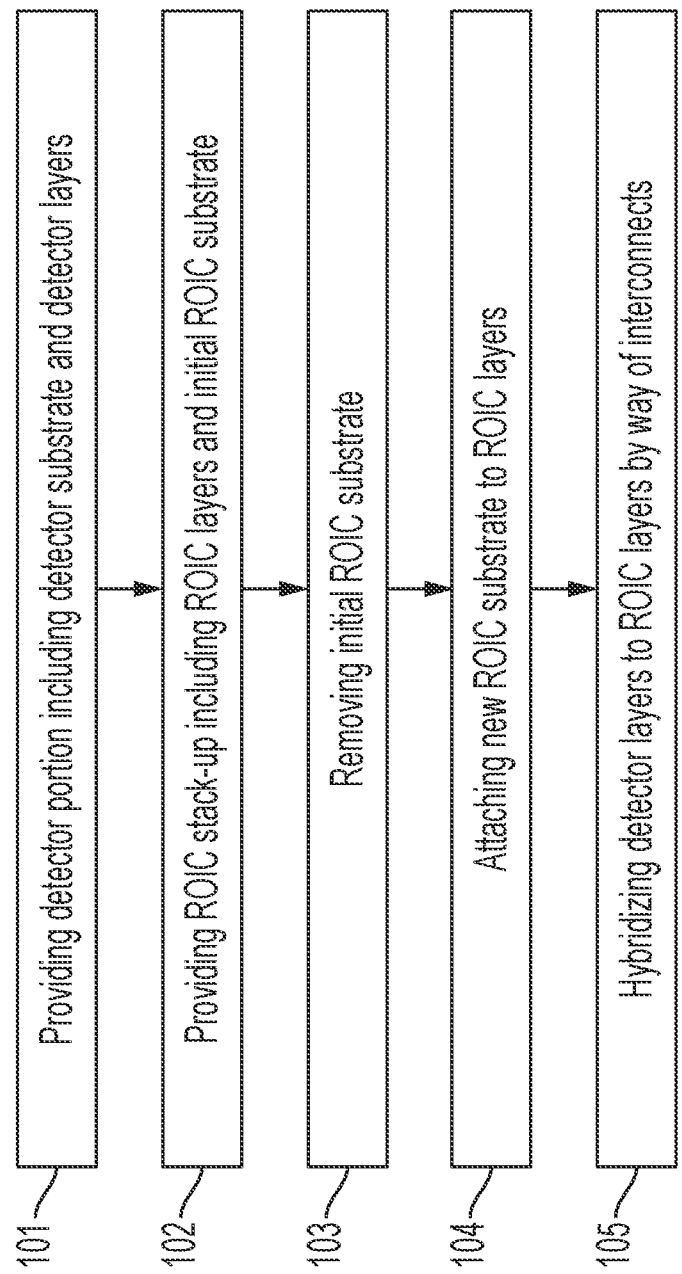
FIG. 1 is a flow diagram illustrating a method of eliminating interconnect strains in a stack-up in accordance with embodiments.
Figure 2:
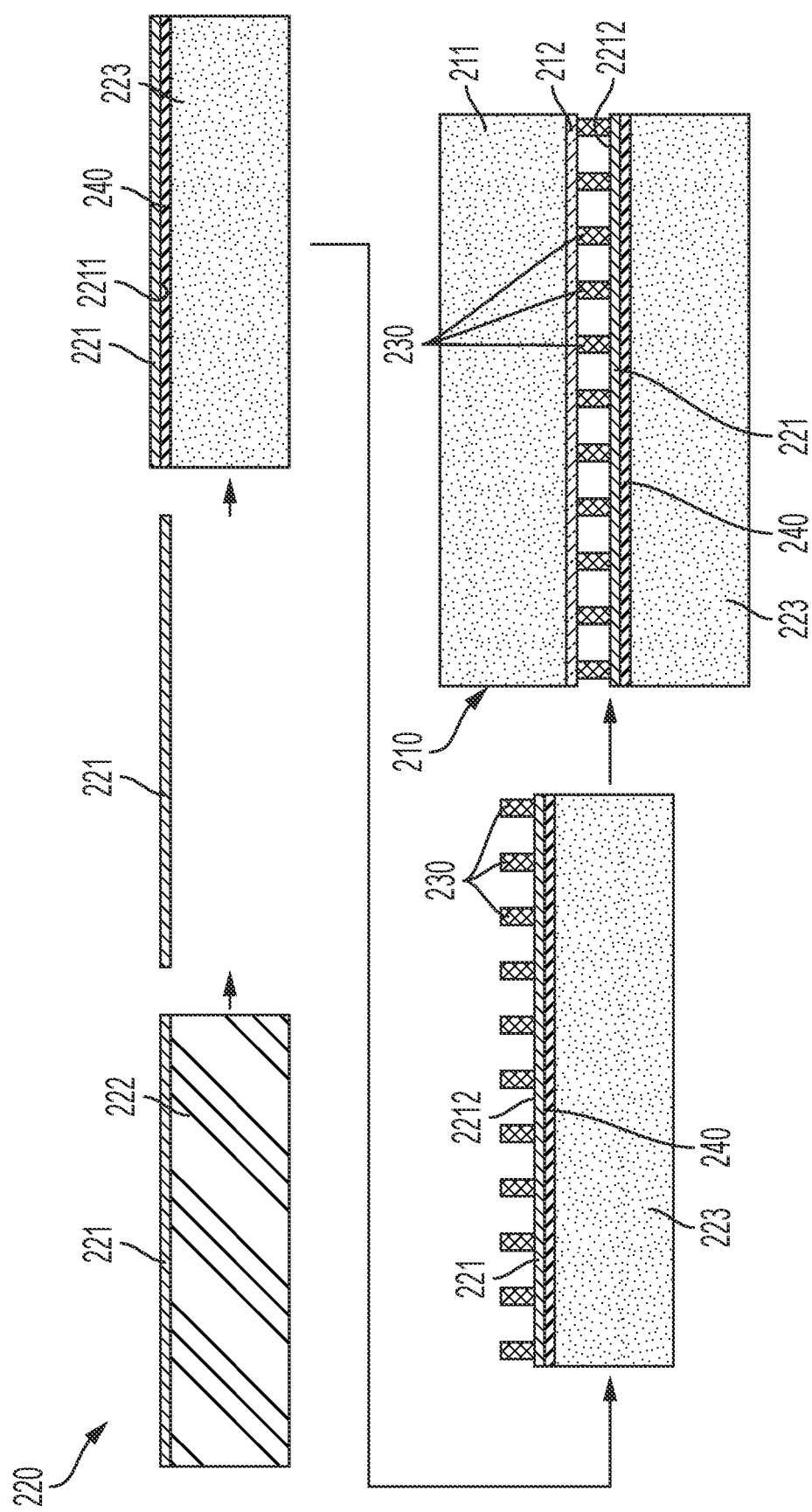
FIG. 2 is a graphical flow diagram illustrating the method of FIG. 1 in accordance with embodiments.

With reference to FIGS. 1 and 2, a method of eliminating interconnect strains in a stack-up, such as a stack-up assembly of a sensor chip assembly (SCA), is provided. The method includes providing a detector portion 210 that includes a detector substrate 211 and detector layers 212 (block 101) and providing a ROIC stack-up 220 that includes ROIC layers 221 and an initial ROIC substrate 222 (block 102) that can include or be provided with silicon, germanium or another suitable semiconductor material. The method also includes removing the initial ROIC substrate 222 from the ROIC layers 221 (block 103) and attaching a new ROIC substrate 223 to a first surface 2211 of the ROIC layers 221 (block 104). The removing of the initial ROIC substrate 222 from the ROIC layers 221 of block 103 can include removal of an entirety of the initial ROIC substrate 222. The first surface 2211 of the ROIC layers 221 can be a lower surface of the ROIC layers 221. The new ROIC substrate 223 has a CTE that matches a CTE of the detector substrate 211. In addition, the method includes hybridizing the detector layers 212 to a second surface 2212 of the ROIC layers 221 by way of interconnects 230 (block 105). The second surface 2212 of the ROIC layers 221 can be an upper surface that is opposite the lower surface. The interconnects 230 can include or be provided as Indium interconnects, for example, or as interconnects formed of other suitably conductive materials.

In accordance with embodiments, the attaching of the new ROIC substrate 223 to the first surface 2211 of block 104 can include adhering (or low-temperature bonding) or atomic bonding the new ROIC substrate 223 to the first surface 2211 (see, e.g., the adhesive/atomic bond 240 of FIG. 2). In the former case, the interconnects 230 are deposited prior to or following the adhering. In the latter case, the interconnects 230 are deposited following the atomic bonding. Also, the hybridizing of block 105 can include depositing the interconnects 230 as pillars onto the second surface 2212 of the ROIC layers 221 or alternately depositing the interconnects 230 as partial-pillars or half-pillars onto the second surface 2212 and as corresponding partial-pillars or half-pillars onto the detector layers 212.

The CTE of the new ROIC substrate 223 can exactly match the CTE of the detector substrate 211. Additionally or alternately, the new ROIC substrate 223 includes or consists of a same material as the detector substrate 211. Where the CTE of the new ROIC substrate 223 exactly matches the CTE of the detector substrate 211, the new ROIC substrate 223 can include multiple materials or material gradients that have an effective overall CTE that exactly matches the CTE of the detector substrate 211.

In accordance with embodiments, the detector substrate 211 can include or be provided with cadmium-zinc-tellurium (CdZnTe), a semiconductor such as an III-V semiconductor or another suitable material. In these or other cases, the new ROIC substrate 223 can include or be provided with cadmium-zinc-tellurium (CdZnTe), a semiconductor such as an III-V semiconductor or another suitable material. The detector layers 212 can include or be provided with mercury-cadmium-tellurium (HgCdTe), a semiconductor such as an III-V semiconductor or another suitable material and the ROIC layers 221 can include or be provided as ROIC metallization layers.

Figure 3:
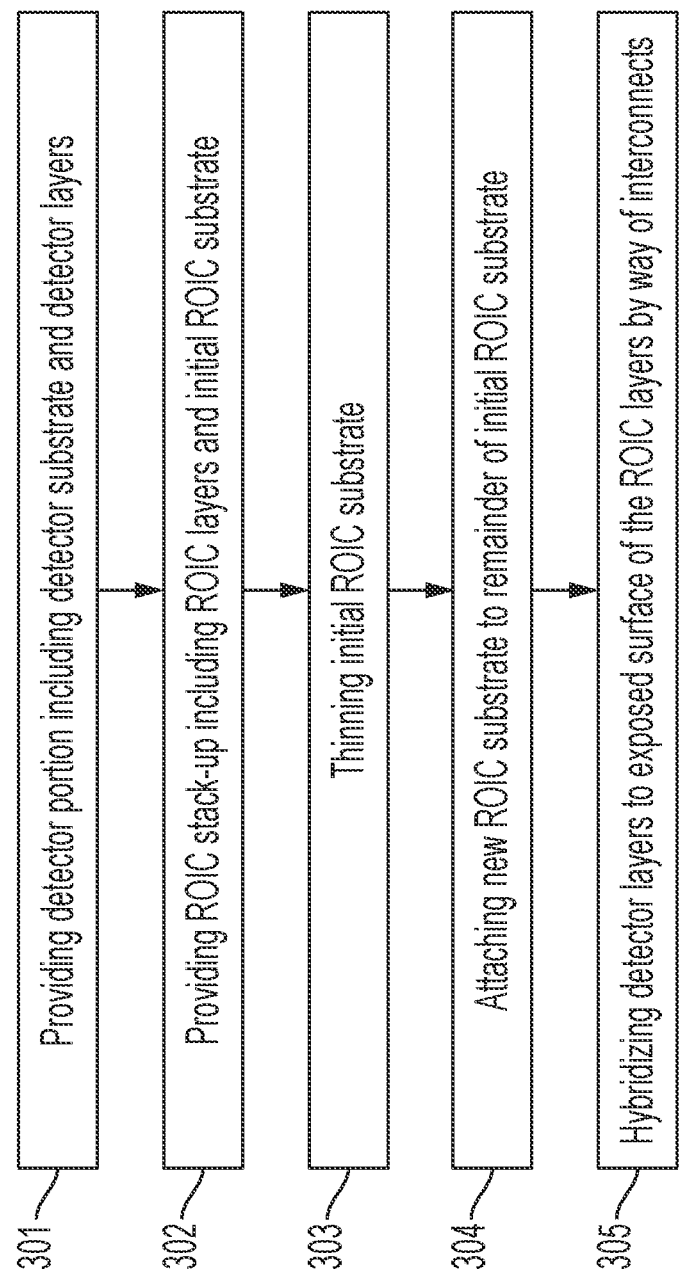
FIG. 3 is a flow diagram illustrating a method of eliminating interconnect strains in a stack-up in accordance with embodiments.
Figure 4:
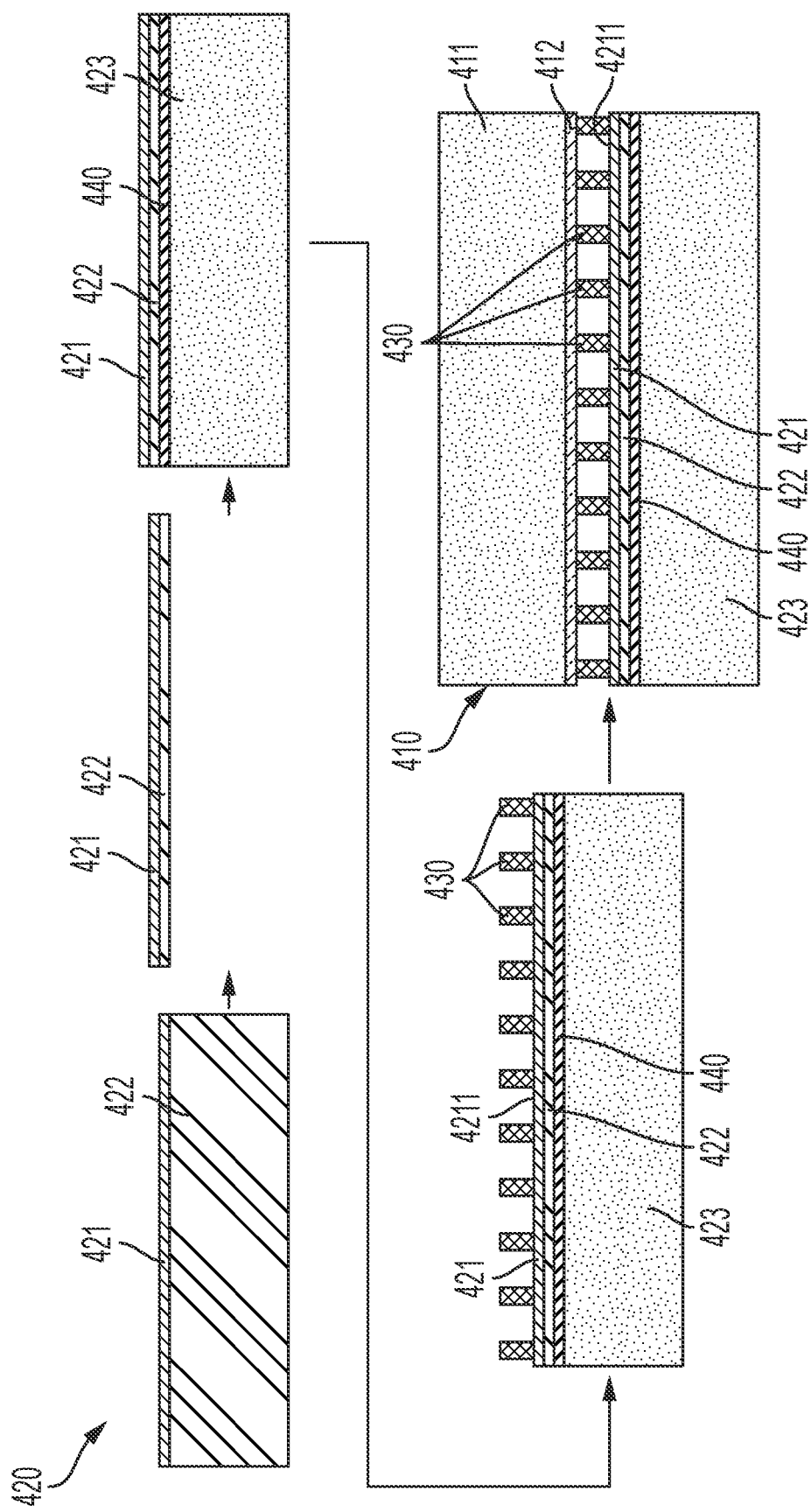
FIG. 4 is a graphical flow diagram illustrating the method of FIG. 3 in accordance with embodiments.

With reference to FIGS. 3 and 4, a method of eliminating interconnect strains in a stack-up, such as a stack-up assembly of a sensor chip assembly (SCA), is provided. The method includes providing a detector portion 410 that includes a detector substrate 411 and detector layers 412 (block 301) and providing a ROIC stack-up 420 that includes ROIC layers 421 and an initial ROIC substrate 422 (block 302) that can include or be provided with silicon, germanium or another suitable semiconductor material. The method also includes thinning the initial ROIC substrate 422 (block 303) and attaching a new ROIC substrate 423 to a remainder of the initial ROIC substrate 422 (block 304). The thinning of the initial ROIC substrate 422 of block 303 can include retaining a thin portion of the initial ROIC substrate 422. The thin portion of the initial ROIC substrate 422 can be about 10 μm thick. The new ROIC substrate 423 has a CTE that matches a CTE of the detector substrate 411. In addition, the method includes hybridizing the detector layers 412 to an exposed surface 4211 of the ROIC layers 421 by way of interconnects 430 (block 305). The exposed surface 4211 of the ROIC layers 421 can be an upper surface that is opposite the new ROIC substrate 423. The interconnects 430 can include or be provided as Indium interconnects for example.

In accordance with embodiments, the attaching of the new ROIC substrate 423 to the remainder of the initial ROIC substrate 422 of block 304 can include adhering (or low-temperature bonding) or atomic bonding the new ROIC substrate 423 to the remainder of the initial ROIC substrate 422 (see, e.g., the adhesive/atomic bond 440 of FIG. 4). In the former case, the interconnects 430 are deposited prior to or following the adhering. In the latter case, the interconnects 430 are deposited following the atomic bonding. Also, the hybridizing of block 305 can include depositing the interconnects 430 as pillars onto the exposed surface 4211 of the ROIC layers 221 or alternately depositing the interconnects 430 as partial-pillars or half-pillars onto the exposed surface 4211 and as corresponding partial-pillars or half-pillars onto the detector layers 412.

The CTE of the new ROIC substrate 423 can exactly match the CTE of the detector substrate 411. Additionally or alternatively, the new ROIC substrate 423 includes or consists of a same material as the detector substrate 411. Where the CTE of the new ROIC substrate 423 exactly matches the CTE of the detector substrate 411, the new ROIC substrate 423 can include multiple materials or material gradients that have an effective overall CTE that exactly matches the CTE of the detector substrate 411.

In accordance with embodiments, the detector substrate 411 can include or be provided with cadmium-zinc-tellurium (CdZnTe), a semiconductor such as an III-V semiconductor or another suitable material. In these or other cases, the new ROIC substrate 423 can include or be provided with cadmium-zinc-tellurium (CdZnTe), a semiconductor such as an III-V semiconductor or another suitable material. The detector layers 412 can include or be provided with mercury-cadmium-tellurium (HgCdTe), a semiconductor such as an III-V semiconductor or another suitable material and the ROIC layers 421 can include or be provided as ROIC metallization layers.

Figure 5:
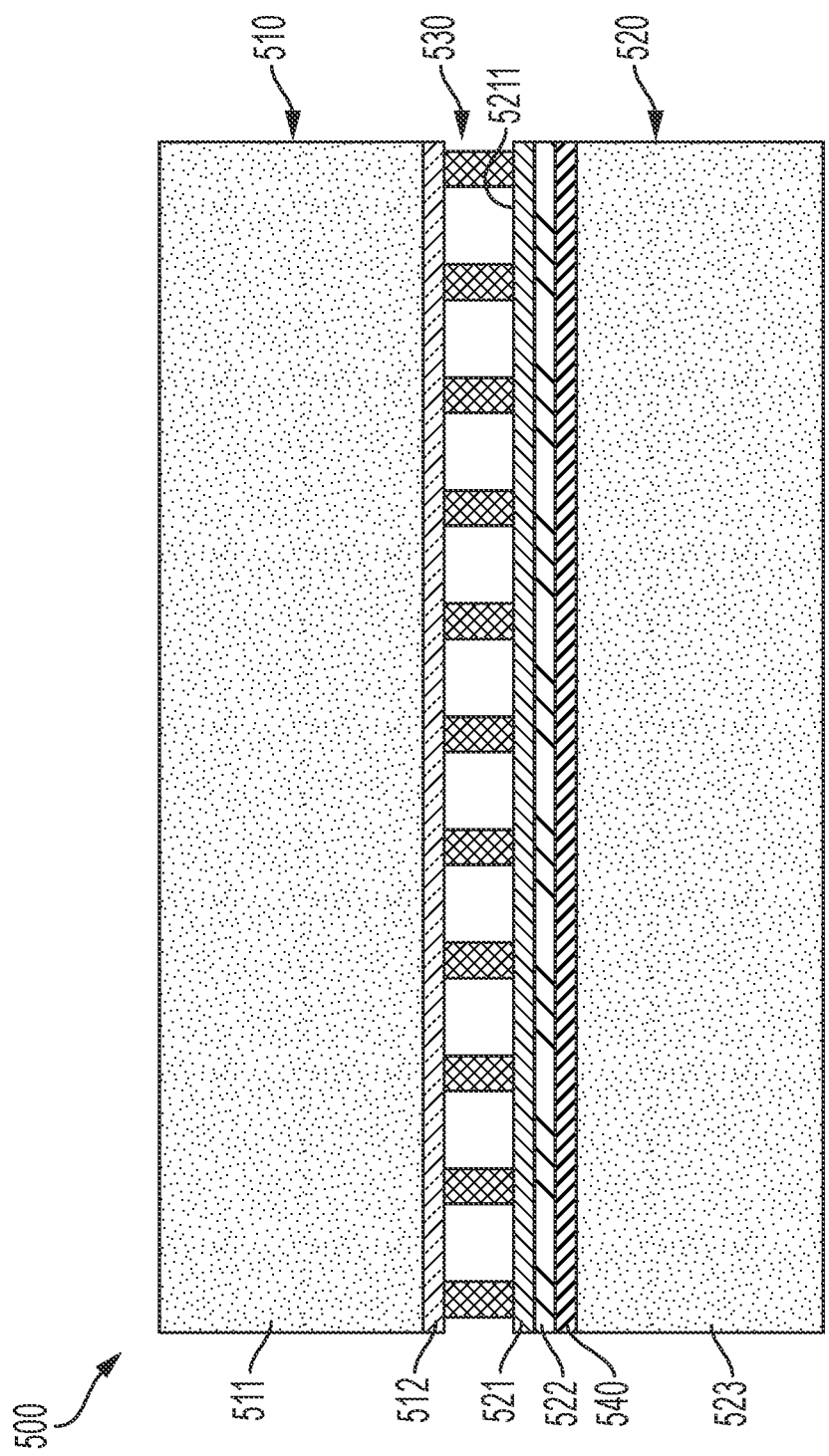
FIG. 5 is a schematic side view of a stack-up in accordance with embodiments.

With reference to FIG. 5, a stack-up 500 is provided and can be configured as a stack-up of an SCA. In any case, the stack up 500 includes a detector portion 510, a ROIC stack-up 520 and interconnects 530, such as Indium interconnects for example. The detector portion 510 includes a detector substrate 511 and detector layers 512. The ROIC stack-up 520 includes ROIC layers 521, a thinned initial ROIC substrate 522 and a new ROIC substrate 523. The new ROIC substrate 523 is attached to the thinned initial ROIC substrate 522 and has a CTE that matches a CTE of the detector substrate 511. The detector layers 512 are hybridized to an exposed surface 5211 of the ROIC layers 521 by way of the interconnects 530. The exposed surface 5211 of the ROIC layers 521 can be an upper surface of the ROIC layers 521 opposite the new ROIC substrate 523. The new ROIC substrate 523 can be adhered or atomic bonded to the thinned initial ROIC substrate 522 (see, e.g., the adhesive/atomic bond 540 of FIG. 5).

The CTE of the new ROIC substrate 523 exactly matches the CTE of the detector substrate 511. Additionally or alternatively, the new ROIC substrate 523 includes or consists of a same material as the detector substrate 511. Where the CTE of the new ROIC substrate 523 exactly matches the CTE of the detector substrate 511, the new ROIC substrate 523 can include multiple materials or material gradients that have an effective overall CTE that exactly matches the CTE of the detector substrate 511.

In accordance with embodiments, the detector substrate 511 can include or be provided with cadmium-zinc-tellurium (CdZnTe), a semiconductor such as an III-V semiconductor or another suitable material. In these or other cases, the new ROIC substrate 523 can include or be provided with cadmium-zinc-tellurium (CdZnTe), a semiconductor such as an III-V semiconductor or another suitable material. The detector layers 512 can include or be provided with mercury-cadmium-tellurium (HgCdTe), a semiconductor such as an III-V semiconductor or another suitable material and the ROIC layers 521 can include or be provided as ROIC metallization layers.

Technical effects and benefits of the present disclosure are the provision of optical elements or products in which the detector and the ROIC experience minimal differential thermal expansion and thus present the potential for virtually unlimited cooldown cycles. The disclosures provided herein improve the hybrid reliability of interconnects, or, in the case of infrared (IR) direct-bond hybridization (DBH), the disclosures result in reduced detector and ROIC stresses. For example, the use of detector epoxy wicking or DBH changes the thermal cycle hybrid reliability problem into a detector stress problem. Also, the disclosures can virtually eliminate bowing of the detector which has been identified with producing image artifacts, and the detector material being used as the ROIC substrate results in lower stresses between the sensor chip assembly (SCA) and a platform/pedestal, which usually has a CTE close to that of the detector substrate.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A stack-up assembly, comprising:
   a detector portion comprising a detector substrate and a detector layers;
   a read-out integrated circuit (ROIC) stack-up comprising a ROIC layers, a thinned initial ROIC substrate and a new ROIC substrate attached to the thinned initial ROIC substrate, the new ROIC substrate having a coefficient of thermal expansion (CTE) that matches a CTE of the detector substrate; and
   interconnects by which the detector layer is hybridized to an exposed surface of the ROIC layer,
   wherein the new ROIC substrate comprises cadmium-zinc-tellurium and the CTE of the new ROIC substrate exactly matches the CTE of the detector substrate.

2. The stack-up assembly according to claim 1, wherein the exposed surface of the ROIC layers is an upper surface of the ROIC layers opposite the new ROIC substrate.

3. The stack-up assembly according to claim 1, wherein the new ROIC substrate is adhered to the thinned initial ROIC substrate.

4. The stack-up assembly according to claim 1, wherein the new ROIC substrate is atomic bonded to the thinned initial ROIC substrate.

5. The stack-up assembly according to claim 1, wherein:
   the detector substrate comprises cadmium-zinc-tellurium, the detector layer comprises mercury-cadmium-tellurium, and the ROIC layer comprises ROIC metallization.

6. A stack-up assembly, comprising:

a detector portion comprising a detector substrate and a detector layer;

a read-out integrated circuit (ROIC) stack-up comprising a ROIC layer, a thinned initial ROIC substrate and a new ROIC substrate attached to the thinned initial ROIC substrate, the new ROIC substrate having a coefficient of thermal expansion (CTE) that matches a CTE of the detector substrate; and interconnects by which the detector layer is hybridized to an exposed surface of the ROIC layer, wherein the detector substrate and the new ROIC substrate each consist of cadmium-zinctellurium.

\* \* \* \* \*